United States Patent [19]

Kolesar et al.

[11] Patent Number: 4,817,851
[45] Date of Patent: Apr. 4, 1989

[54] SURFACE MOUNT TECHNOLOGY REPAIR STATION AND METHOD FOR REPAIR OF SURFACE MOUNT TECHNOLOGY CIRCUIT BOARDS

[75] Inventors: Michael J. Kolesar, Derry; Philip J. Bois, Manchester, both of N.H.

[73] Assignee: Digital Equipment Corporation, Maynard, Mass.

[21] Appl. No.: 169,109

[22] Filed: Mar. 9, 1988

Related U.S. Application Data

[63] Continuation of Ser. No. 829,445, Feb. 13, 1986, abandoned.

[51] Int. Cl.$^4$ ............................................. B23K 31/00
[52] U.S. Cl. ...................................... 228/119; 228/242; 228/20
[58] Field of Search .................... 228/119, 20, 242; 219/370; 432/8, 59, 239

[56] References Cited

U.S. PATENT DOCUMENTS

| | | | |
|---|---|---|---|
| 3,515,330 | 6/1970 | Bronson et al. | 228/20 |
| 3,644,980 | 2/1972 | Class, Jr. et al. | 29/203 B |
| 4,066,204 | 1/1978 | Wirbser et al. | |
| 4,295,596 | 10/1981 | Doten et al. | 228/180 A |
| 4,366,925 | 1/1983 | Fanene | 228/20 |
| 4,426,571 | 1/1984 | Beck | 228/20 |
| 4,528,746 | 7/1985 | Yoshimura | |
| 4,602,316 | 7/1986 | Feick | 29/830 |

FOREIGN PATENT DOCUMENTS

| | | |
|---|---|---|
| 2321910 | 1/1974 | Fed. Rep. of Germany |
| 2307286 | 9/1974 | Fed. Rep. of Germany |
| 2512623 | 9/1976 | Fed. Rep. of Germany |
| 0079848 | 4/1982 | Fed. Rep. of Germany |
| 206028A | 1/1984 | Fed. Rep. of Germany |
| 2925347 | 1/1984 | Fed. Rep. of Germany |
| 2418992 | 3/1978 | France |
| 54-6459A | 6/1979 | Japan |
| 0147864 | 12/1984 | Japan |
| 984081A | 12/1982 | U.S.S.R. |

OTHER PUBLICATIONS

Surface-Mounted Component Desoldering Tool, IBM Tech Disc Bull, vol. 28, No. 9, Feb. 1986, pp. 3946–3949, US Class No. 29/762.
Repair of Integrated Circuits, Western Electric Tech Digest No. 3, 7/66, Class No. 228/264.
Use of a Heated Gas Jet to Remove a Silicon Chip Soldered to a Substrate, IBM Tech Disc Bull, vol. 20, No. 9, 2/78, Class 228/264.
Component Rework with Low-Melt Alloy Solder IBM Tech Disc Bull, vol. 21, No. 12, 5/79, Class 228/264.

*Primary Examiner*—Nicholas P. Godici
*Assistant Examiner*—Karen Skillman
*Attorney, Agent, or Firm*—Nutter, McClennen & Fish

[57] ABSTRACT

A surface-mount-technology repair station and method for replacing components on SMT circuit boards. The station includes a base with a controllable heating element through which deionized air is blown onto the surface of a board opposite to the surface on which the repair is to be effected. This raises the temperature of the entire board substantially but to a point below the melting point of solder. A second heating element through which deionized air is blown is positioned over the leads of a selected component positioned on the board, that is either to be removed from or secured to the board. The heating of the leads by the second heating element causes the solder on these leads to melt, thus, enabling replacement of the component. To remove the component, the operator, using an instrument, such as tweezers, grasps the component and removes it from the board. To install a component, the operator, after melting solder on the leads, discontinues the heating of the component.

The method of the present invention includes the steps of heating the surface-mount-technology boards to a substantially high temperature, and then heating the leads of a selected component to be replaced so that the solder disposed on the leads melts.

29 Claims, 1 Drawing Sheet

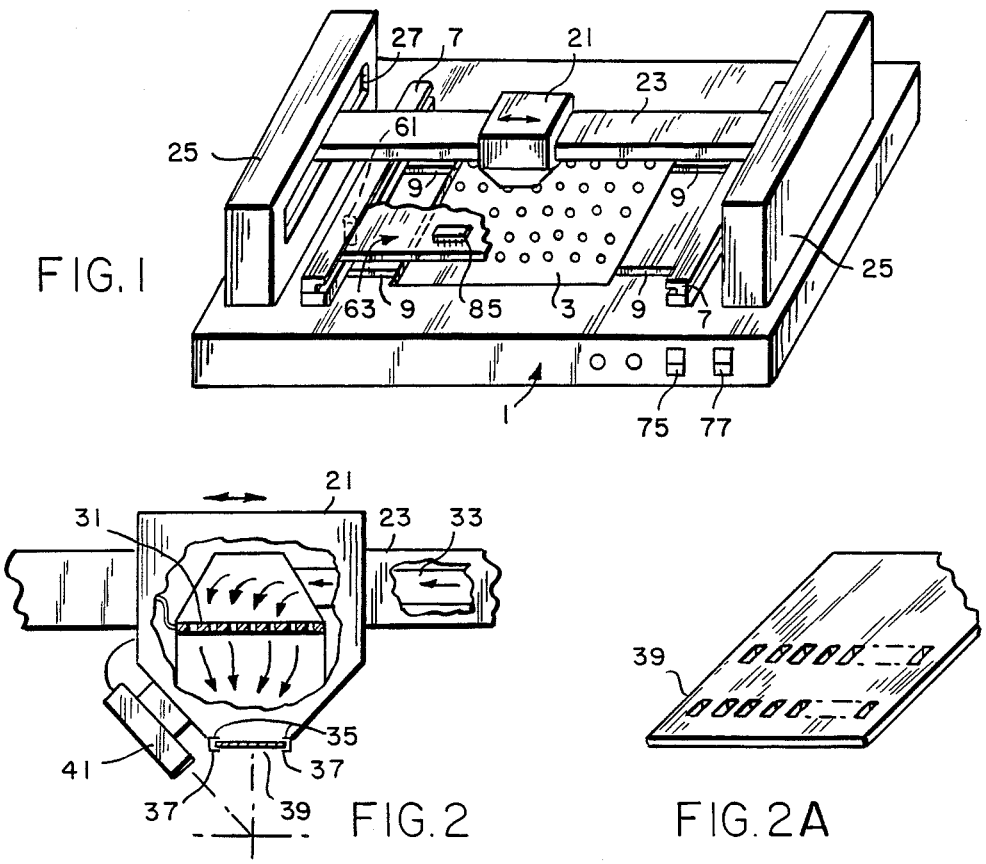
FIG. 1
FIG. 2
FIG. 2A
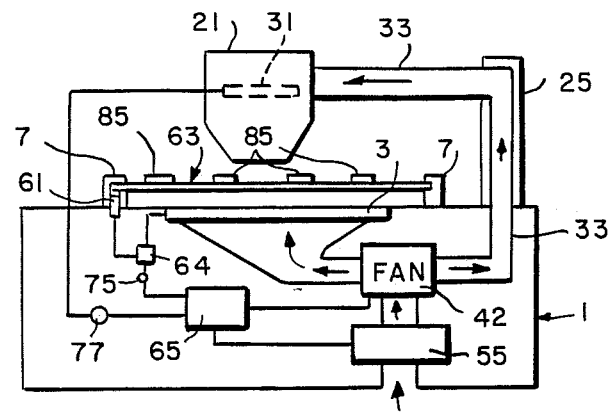
FIG. 3

SURFACE MOUNT TECHNOLOGY REPAIR STATION AND METHOD FOR REPAIR OF SURFACE MOUNT TECHNOLOGY CIRCUIT BOARDS

This application is a continuation of application Ser. No. 829,445, filed with the U.S. Patent and Trademark Office on Feb. 13, 1985, now abandoned.

Reference is made to a related patent application, Ser. No. 764,534, invented by Michael J. Kolesar, entitled SURFACE MOUNT TECHNOLOGY AUTOMATED REPAIR SYSTEM, and filed in the U.S. Patent and Trademark Office on Aug. 12, 1985, the disclosure of which is incorporated herein by reference.

This invention relates generally to an apparatus and method for the repair of printed circuit board having surface-mounted components positioned thereon.

BACKGROUND OF THE INVENTION

Electronic circuit assemblies which include a plurality of different electronic components mounted together on modules, often called a circuit boards, are common in computer and other electronic equipment. The boards are usually formed of a fiberglass-filled composition. Each of the electronic components on a board has leads which are electrically interconnected to leads on other components by conductors directly formed on the board.

In conventional assemblies of this type, the electronic components are mounted on one surface of the board, and the leads of the components pass through plated holes to the opposite surface of the board where they are soldered, to thereby secure the components to the board, as well as make the required electrical connections. Surface mount technology (SMT) boards differ from conventional boards in that the component leads are soldered to conductive "pads" disposed on the surface to which the particular component is to be mounted. The leads, therefore, need not, and generally do not, pass through holes to the opposite surface of the board. This surface-mount technology is finding increasing usage in the manufacture of circuit board assemblies, because it has marked advantages over prior conventional technology. Specifically, the procedures for producing SMT board assemblies are generally simpler and more economical than the procedures to fabricate conventional board assemblies.

Further, SMT board assemblies permit reductions in the sizings of the individual components mounted on the boards and reductions in the sizes of the boards as well. They also permit the unrestricted mounting of components on both surfaces of the boards, thus providing denser assemblies, i.e. with increased circuitry disposed in less space.

In a typical SMT board repair apparatus, a component to be removed is heated by a hand-held hot air blower to a temperature such that the solder, which joins the leads of the component to the SMT board at solder pads on the board, melts. The component is then removed. In like fashion, components are added to SMT board assemblies by placing the leads, which have a solder paste applied thereto, on the pads of the SMT board and then applying a directed hot air flow over the component and the leads such that the solder paste is liquidified. Renewal of the heat source then permits the solder to solidify and thereby secure the component to the board.

An alternative repair method involves the use of a hand-held soldering iron, which functions much like a pair of tweezers. The tips of the iron, when squeezed together, have a shape matching the perimeter of the component to be removed from the SMT board. The tips of the iron are positioned on the leads of the component to be removed and the iron is heated until the operator observes the solder melting sufficiently to permit the component to be removed from the board. For installing components on the SMT board, this procedure is reversed.

Both of the above-referenced methods of repair are slow and tedious, and require a significant amount of manual dexterity in their applications. The application of heat necessary to melt the solder can result in damage to the SMT board itself, and the conductors found thereon, in the form of buckling or even delamination. The use of hot air circulation over the board also causes, in some instances, electrostatic discharge damage to components positioned on the board, due to the presence of ions in the heated air.

In light of the above, it is an object of this invention to provide an improved apparatus and method for the repair of surface-mount-technology circuit board assemblies. Another object of this invention is to provide an SMT circuit board repair apparatus which is semi-automatic and requires little operator training and only routine operator involvement.

Still another object of the invention is to provide an SMT circuit board repair apparatus and method which minimizes the likelihood of damage to the board and to the components on the board.

Other objects will be specified in or obvious from the detailed description of the illustrated embodiments of the invention which follows.

SUMMARY OF THE INVENTION

In the present invention, a surface-mount-technology repair station for replacing components on SMT circuit boards includes a base with a controllable heating element through which deionized air is blown onto the surface of a board opposite to the surface on which the repair is to be effected. This raises the temperature of the entire board substantially but to a point below the melting point of solder. A second heating element through which deionized air is blown is positioned over the leads of a selected component positioned on the boards, that is either to be removed from or secured to the board. The heating of the leads by the second heating element causes the solder on these leads to melt, thus, enabling replacement of the component. To remove the component, the operator, using an instrument, such as tweezers, grasps the component and removes it from the board. To install a component, the operator, after melting solder on the leads, discontinues the heating of the component.

Because of the elevated temperature of the entire board, there is a lesser temperature differential between the portions where soldering or desoldering is taking place and other portions of the board, than in prior methods. This lesser differential prevents the delamination and related damage that would otherwise result from differential thermal expansion. Also, deionization of the air that is used to supply heat to the board materially reduces the occurrence of damage due to electrostatic discharge.

The method of the present invention includes the steps of heating the surface-mount-technology boards to a substantially high temperature, and heating the leads of a selected component to be replaced so that the solder disposed on the leads melts. The method can further include directing deionized air over the board and components thereon.

BRIEF DESCRIPTION OF THE DRAWINGS

The foregoing objects, features, and advantages of the invention will be better understood from the following detailed description taken with the accompanying drawings in which:

FIG. 1 is a perspective view of the SMT repair station in accordance with the present invention;

FIG. 2 is an enlarged, cutaway view of the transverse arm, with an upper housing thereof, of the SMT repair station of FIG. 1;

FIG. 2A is an enlarged view of an orifice plate, positionable in the upper housing of FIG. 2; and FIG. 3 is a partly schematic view of the SMT repair station of FIG. 1.

DETAILED DESCRIPTION OF THE PREFERRED EMBODIMENTS

With reference to FIG. 1, an surface-mount-technology repair station embodying the present invention has a base 1 with a perforated infrared panel 3 disposed therein. Module holding fixtures 7 supporting an SMT circuit board 63, are positioned on the base 1 and are slidable in elongated slots 9 in the base.

An upper housing 21 is slidably positioned on a transverse rod 23. The rod 23 is supported for movement perpendicular to its longitudinal axis by mounting blocks 25. Specifically, each of the blocks 25 has an aperture 27 for receiving and supporting an end of the transverse rod 23. Thus, the housing 21 and rod 23 can be easily displaced to bring the housing over any desired location on the circuit board 63.

With reference to FIG. 2, an infrared panel 31 having apertures therein, is mounted in the upper housing 21. A flexible, extendable air line 33 extends through a mounting block 25 and the transverse rod 23 so that air blown through the air line 33 passes through the apertures in the panel 31. The housing 21 is provided with a mounting receptacle 35, which has two elongated U-shaped members 37, sized to receive interchangeable orifice plates, such as the orifice plate seen at 39 (See FIG. 2A). Manual location of the housing 21 with respect to the circuit board 63 is facilitated by a high intensity light source 41 which is carried by the housing 21 and aims a light at the point on the board 63 directly beneath the center of the aperture plate 39.

Referring now to FIG. 3, a fan 42 draws air from the atmosphere through the base 1 and the air is directed through apertures in the infrared panels 3 and 31 via an air line 43 and the air line 33, respectively. The lower surface of the board 63 is thus heated by panel 3, both by infrared energy transmission and the air heated by passage through the panel 3. The portions of the upper surface of the board beneath the apertures in the plate 39 (FIG. 2a) are heated by the panel 31, both by infrared energy transmitted and by air flow through the plate 39. Air entering the base 1 is drawn by the fan 42 through a deionizing chamber 55, which deionizes the air passing therethrough in a known manner.

As also shown in FIG. 3, a thermocouple 61 is positioned in one of the mounting fixtures 7 so as to contact the board 63. A controller unit 64, to which the thermocouple 61 is connected, operates to control the heat supplied by infrared panel 3 to the board 63 so as to maintain the panel at an elevated temperature, as discussed below. Electric current is provided to heat the infrared panel 3 from a source external to the unit through a transformer 65. A manual on-off switch 75 provides operator control for the infrared panel 3, and likewise, a switch 77 provides operator control for the infrared panel 31.

The use and function of the above-described unit are as follows: A module, such as the circuit board 63, having surface mounted components, such as integrated circuit chips 85, positioned thereon, is positioned in the movable fixtures 7. The board 63 is heated from underneath by the infrared panel 3. The temperature to which the board 63 is preferably heated to a substantially elevated temperature such that the board has reached its thermal expansion limit over the relevant temperature range. In the case of a board formed of a composition not having such a thermal expansion limit, the board is heated to a substantially elevated temperature, such that the thermal thermal expansion, resulting from the melting of the solder in the leads of the selected component to be replaced, is minimal. This elevated temperature, in any event, should be below the melting temperature of the solder used to secure the components to the board.

The board 63 is, thus, for ordinary fiberglass boards usually heated to a temperature approximately between 285° and 300° F., which is above the "glass transition" temperature of the board, such that only minimal thermal expansion of the board 63 results from the melting of the solder on the leads of the selected component to be replaced. The operator of the repair assembly inserts into the brackets 37 an orifice plate, such as the plate 39, which has apertures corresponding with the leads of a selected component 85 to be removed. The orifice plates, preferably, should be formed of material, such as aluminum, that will not deform from repeated heatings.

The upper housing 21 is then positioned by the operator above the selected component 85 to be removed. The high intensity light assists the operator in this task. The upper infrared panel 31 is heated and deionized air is blown through the apertures in the panel. The radiant energy of the panel 31 and the deionized air is directed by the orifice plate 39 to the leads of the component 85. Upon the melting of the solder, usually at a temperature of approximately 500° F., the component 85 is thereby removable from the board 63.

The installation of components is essentially the same. After positioning and heating the board 63, the component 85 to be installed, having solder paste disposed on its leads, is positioned with its leads on soldering pads positioned on the board 63. The operator inserts in the brackets 37 an orifice plate 39, having apertures which correspond with the leads of the component 85. The upper housing 21 is aligned by the operator over the component with the reference beam of the high intensity light 41. The infrared panel 31 is then turned on, and deionized air is blown through the orifice plate 39 to the leads of the component 85. Upon the liquifaction of the solder paste, the heating is stopped so that the component is secured to the board by the subsequent solidification of the solder.

It will be recognized and understood that the present invention minimizes damage to SMT circuit boards and the components positioned thereon. The heating of the entire board reduces the likelihood of damage to the board such as possible delamination or buckling resulting from uneven heating. The directing of deionized air over the board and components thereon, also reduces the likelihood of electrostatic discharge damage to the components disposed on the board. The present invention also simplifies manual tasks to be performed by the operators of the device, as compared with those devices of the prior art.

What is claimed as new and desired to be secured by Letters Patent of the United States is:

1. A repair station for replacing components on circuit boards comprising:
    a frame;
    means for removably mounting a circuit board on said frame;
    a first heating means carried by said frame;
    said first means for heating an entire circuit board to and maintaining the circuit board at a substantially uniform elevated temperature, but below the melting point of solder used to secure the leads of components to said circuit board;
    a second heating means movably carried by said frame;
    said second means for heating the leads of a selected component, such that solder or the leads of the second component melts;
    a transverse rod movably mounted in a track on said frame; and
    a housing carrying said second heating means is mounted for slidable movement along said rod, whereby positioning of said second heating means relative to a selected component is accomplished by movement of said rod and said housing.

2. A repair station according to claim 1, wherein, when said board is formed of a fiberglass composition, the temperature to which said first heating means heats said board is a temperature greater than the glass-transition temperature of said board.

3. A repair station according to claim 1, wherein said first and second heating means include apertured, infrared heating panels and means for blowing air through the apertures in the panels, and means for directing the the air blown through the first panel to the circuit board and the air blown through the second panel to the leads of a selected component.

4. A repair station according to claim 3, further comprising means for deionizing air, whereby the air directed to a board positioned in said mounting means from said first and second panels is heated deionized air.

5. A repair station according to claim 1 wherein said means for mounting circuit boards positions a circuit board mounted in said mounting means between said first and second heating means.

6. A repair station according to claim 5, wherein said first heating means includes a large heating panel of a size substantially equal to the largest board mountable in said mounting means, means for blowing air through said large panel, and means for directing air blown through said large panel to a board positioned in said mounting means whereby the board is heated, and said second means includes a small heating panel of a size approximately equal to components mounted on SMT boards, means for blowing air through said panel, and means for directing air blown through said small panel to a selected component positioned on an SMT board positioned in said mounting means, whereby solder on the leads of the selected component melts.

7. A repair station according to claim 3, wherein said second infrared panel is of a size approximately equal to components mounted on circuit boards and said first infrared panel is of a size substantially equal to the largest circuit board mountable in said means for removably mounting.

8. A repair station according to claim 3 further comprising controlling means for controlling the temperature to which a circuit board mounted in said mounting means is heated by said first means for heating.

9. A repair station according to claim 8 wherein said first heating means heats the circuit board to a temperature approximately between 285° F. and 300° F. and said means for controlling the temperature of a circuit board maintains the temperature of said circuit board substantially between 285° F. and 300° F.

10. A repair station according to claim 3 further comprising a removable orifice plate positioned below said second infrared panel, wherein said oriface plate has apertures therein which correspond to the leads of the selected component to be replaced.

11. A repair station for replacing components on circuit boards comprising:
    a base;
    a transverse rod supported on each end by said base, such that said rod is movable in a direction perpendicular to its longitudinal axis;
    a fan disposed in said base;
    mounting fixtures secured to said base for removably supporting circuit boards between said base and said rod;
    a housing slideably positioned on said rod;
    an infrared heating panel, having apertures therein, mounted in said housing; and
    an air path from said fan to said panel, such that air is directed by said fan through the apertures in said panel, whereby, when said housing is positioned above the leads of a component on a board disposed in said fixtures, solder on the leads of said component is thereby liquified.

12. A repair station according to claim 11, further comprising:
    a lower infrared panel, having apertures therein, mounted in said base and between said mounting fixtures; and
    an air path from said fan to said lower panel, such that air is directed by said fan through the apertures in said lower panel,
    whereby, when a board is disposed in said fixtures, the board is heated by said lower panel.

13. A repair station according to claim 12 further comprising means for deionizing the air which is directed from said fan to said board, whereby the occurrence of static-electric discharge damage to boards repaired at said station is reduced.

14. A method of removing and installing components on a circuit board using a circuit board repair station, said method comprising the steps of:
    removably securing a board in a mounting fixture on a circuit board repair station;
    heating the entire circuit board by a first heating unit to an elevated temperature, which is above the glass transition temperature of the circuit board but below the melting point of the solder on the leads of said components on the circuit board;
    heating by the first heating unit includes activating an infrared panel, directing deionized air through the panel and directing this deionized air to the board;
    maintaining the entire circuit board at or near the elevated temperature;

moving and positioning a second heating unit relative to a selected component on the circuit board;

said moving and positioning includes moving a housing containing the second heating unit along a transverse beam on which the housing is carried and moving the beam in a track provided in said station; and said heating the leads includes activating the second heating element, directing deionized air through the activated element to thereby elevate the temperature of the air and directing the air to the leads of the selected component.

15. A method according to claim 14 further comprising the steps of disposing on the leads of a selected replacement component solder paste;

positioning the replacement component on the circuit board; and discontinuing the heating by said second heating unit after the solder melts whereby the solder solidifies and said component is secured to said board.

16. A method according to claim 14 further comprising discontinuing heating by said second heating unit after said solder has melted; and removing the selected component from the circuit board.

17. A method according to claim 14 further comprising discontinuing the heating by said first and second heating units and removing the board from the station.

18. A method for repair circuit boards comprising the steps of:

removably securing a circuit board in a mounting fixture on a circuit board repair station;

positioning an air vent carried by said station over a selected component on said board said step of positioning air vent includes moving the vent along a cross member movably mounted on a frame and moving said cross member to thereby position said vent over said selected component;

heating the leads of the selected component to an elevated temperature such that solder on the leads melts by directing air through a heating element and the vent;

activating a second heating element carried by the frame; and directing air through the second heating element toward the circuit board to raise the temperature of the circuit board to a substantially uniform elevated temperature.

19. A method according to claim 18 wherein the step of directing air through the second heating element toward the circuit board raises the circuit board to a substantially uniform elevated temperature of approximately between 285°°F. and 300° F.

20. A method according to claim 18 further comprising the steps of:

discontinuing the heating of the leads;
removing the selected component;
positioning a new component with solder paste on the leads on the circuit board;
heating the leads of the new component to melt the solder paste;
discontinuing the heating of the leads; and
removing said board from said repair station.

21. A repair station for repairing SMT circuit boards comprising;

a frame;

means for removably positioning a SMT circuit board on said frame;

means for heating air carried by said frame;

means for directing the air heated by said means for heating onto a selected component disposed on said board so that solder positioned on the leads of the selected component melts;

said means for directing includes a fan for moving the air, a transverse member movably carried by the frame, a housing movably positioned on said transverse member, and an air vent in said housing from which heated air exits said housing, whereby heated air can be directed to a selected component by moving and repositioning said housing and said transverse member;

second means for heating air secured in said frame and;

second means for directing air heated by said second means for heating to a circuit board postioned in said postioning means whereby the temperature of such circuit board is raised to a substantially elevated temperature.

22. A repair station according to claim 21 wherein said first means for heating air includes an infrared heating panel and said infrared heating panel is disposed in said housing.

23. A repair station according to claim 22 further comprising a removable orifice positionable in said air vent, wherein said orifice plate has apertures therein which correspond to the leads of the selected component.

24. A repair station according to claim 22 further comprising means for deionizing air such that the heated air directed onto the leads of a selected component and the air directed toward the circuit board is heated deionized air.

25. A repair station according to claim 21 wherein said first and second means for heating air includes a first and second infrared heating panel.

26. A repair station according to claim 25 wherein said first infrared heating panel is positioned in said housing and said second infrared heating panel is substantially larger than said first panel.

27. A repair station according to claim 26 wherein the temperature of the entire circuit board, when heated by the heated air directed by said record means for directing, is raised to approximately between 285° F. and 300° F.

28. A method according to claim 19 further comprising the steps of:

monitoring the temperature of the temperature of the circuit board; and controlling the second heating element to maintain the circuit board at the substantially uniform elevated temperature of approximately between 285° F. and 300° F.

29. The method of claim 18 wherein the steps of directing air through the heating element and the second heating element include deioninzing the air directed through the heating element and the second heating element whereby heated deionized air is directed to the selected component and the circuit board.

* * * * *